United States Patent
Su et al.

(10) Patent No.: US 11,377,551 B2
(45) Date of Patent: *Jul. 5, 2022

(54) THERMOSETTING RESIN COMPOSITION, PREPREG MADE THEREFROM, LAMINATE CLAD WITH METAL FOIL, AND HIGH-FREQUENCY CIRCUIT BOARD

(71) Applicant: SHENGYI TECHNOLOGY CO., LTD., Guangdong (CN)

(72) Inventors: Minshe Su, Dongguan (CN); Zhongqiang Yang, Dongguan (CN)

(73) Assignee: SHENGYI TECHNOLOGY CO., LTD., Guandong (CN)

( * ) Notice: Subject to any disclaimer, the term of this patent is extended or adjusted under 35 U.S.C. 154(b) by 417 days.

This patent is subject to a terminal disclaimer.

(21) Appl. No.: 16/633,018

(22) PCT Filed: Nov. 2, 2017

(86) PCT No.: PCT/CN2017/109050
§ 371 (c)(1),
(2) Date: Jan. 22, 2020

(87) PCT Pub. No.: WO2019/019464
PCT Pub. Date: Jan. 31, 2019

(65) Prior Publication Data
US 2020/0224026 A1 Jul. 16, 2020

(30) Foreign Application Priority Data

Jul. 26, 2017 (CN) .......................... 201710618289.7

(51) Int. Cl.
| | | |
|---|---|---|
| *C08L 71/12* | (2006.01) | |
| *B32B 15/08* | (2006.01) | |
| *B32B 27/28* | (2006.01) | |
| *C08G 79/04* | (2006.01) | |
| *C08J 5/24* | (2006.01) | |
| *C08K 5/5313* | (2006.01) | |
| *C08L 43/02* | (2006.01) | |
| *C08J 5/04* | (2006.01) | |

(52) U.S. Cl.
CPC ............ *C08L 71/126* (2013.01); *B32B 15/08* (2013.01); *B32B 27/285* (2013.01); *C08G 79/04* (2013.01); *C08J 5/24* (2013.01); *C08K 5/5313* (2013.01); *C08L 43/02* (2013.01); *B32B 2260/046* (2013.01); *B32B 2457/08* (2013.01); *C08J 5/043* (2013.01); *C08J 2371/12* (2013.01); *C08L 2201/02* (2013.01); *C08L 2203/20* (2013.01)

(58) Field of Classification Search
CPC ............ C08K 5/49–5399; C08L 71/12; C08L 71/126; C08L 43/02; C09D 171/12; C09D 143/02; C09J 171/12; C09J 143/02; C08J 2371/12; C08J 2443/02
See application file for complete search history.

(56) References Cited

U.S. PATENT DOCUMENTS

| | | |
|---|---|---|
| 2015/0166788 A1 | 6/2015 | Li et al. |
| 2016/0148719 A1 | 5/2016 | Yin et al. |

FOREIGN PATENT DOCUMENTS

| | | |
|---|---|---|
| CN | 101974156 | 2/2011 |
| CN | 103756315 | 4/2014 |
| CN | 104725857 | 6/2015 |
| CN | 106349442 | 1/2017 |
| CN | 106543228 | 3/2017 |
| CN | 106750226 | 5/2017 |
| JP | S5356250 | 5/1978 |
| JP | 2000336261 | 12/2000 |
| TW | 201632613 | 9/2016 |
| TW | 201704247 | 2/2017 |

OTHER PUBLICATIONS

Chinese First Search Repot issued in Application No. 2017106182897 dated Jul. 1, 2021.
Chinese Office Action issued in 201710618289.7 dated Jun. 2, 2020.
European Search Report issued in Application No. / Patent No. 17919289.3-1102 / 3660027 PCT/CN2017109050 dated Mar. 24, 2021.
Lin Ching Hsuan et al., Catalyst-free Synthesis of Phosphinated Poly (2, 6-dimethyl-1, 4-phenylene oxide) with High-Tg and Low-dielectric Characteristic. Polymer Degradation and Stability. Dec. 4, 2013 (Dec. 4, 2013), vol. 99, pp. 107-109.
International Search Report issued in PCT/CN2017/109050 dated May 9, 2018.
Japanese Office Action issued in 2019557861 dated Oct. 2, 2020.

*Primary Examiner* — Kregg T Brooks
(74) *Attorney, Agent, or Firm* — Workman Nydegger

(57) ABSTRACT

Disclosed are a thermosetting resin composition, a prepreg made therefrom, a laminate clad with a metal foil, and a high-frequency circuit board, wherein the thermosetting resin composition contains thermosetting ingredients. The thermosetting ingredients include a phosphorus-containing monomer or a phosphorus-containing resin and a polyphenylene ether resin containing an unsaturated group, and the phosphorus-containing monomer or the phosphorus-containing resin has a structure as shown in formula I. By using the phosphorus-containing monomer or the phosphorus-containing resin as a cross-linking agent of the polyphenylene ether resin containing an unsaturated group and by means of a cross-linking reaction of a large number of unsaturated double bonds in the resin, the high-frequency dielectric properties and high-temperature-resistance required by a circuit substrate are provided.

21 Claims, No Drawings

THERMOSETTING RESIN COMPOSITION, PREPREG MADE THEREFROM, LAMINATE CLAD WITH METAL FOIL, AND HIGH-FREQUENCY CIRCUIT BOARD

TECHNICAL FIELD

The present invention belongs to the technical field of copper clad laminates, and relates to a thermosetting resin composition, a prepreg, a metal foil-clad laminate and a high-frequency circuit board prepared therefrom.

BACKGROUND ART

In order to transmit and process large-capacity information, operation signals tend to be high-frequency in recent years with the development of high performance, high functionality, and networking of information communication equipments. Thus materials for circuit boards have been demanded.

Among the available materials used for printed circuit boards, epoxy resins having excellent bonding property are widely used. However, epoxy resin circuit boards generally have higher dielectric constant and dielectric loss tangent (a dielectric constant of greater than 4, a dielectric loss tangent of about 0.02). The high frequency characteristics thereof are insufficient, and thus it cannot meet the requirements of high-frequency signals. Therefore, it is necessary to develop a resin having excellent dielectric properties, i.e. a resin having low dielectric constant and dielectric loss tangent.

Although thermoplastic fluororesin (polytetrafluoroethylene) as another type of substrate material has lower dielectric constant and dielectric loss tangent, fluororesins generally have a high melting temperature and a high melt viscosity, so as to have poor flowability and higher molding difficulty. Moreover, there are problems such as workability, dimensional stability, and insufficient adhesion of metal plating films while manufacturing multilayer circuit boards. Therefore, resin materials for printed circuit boards suitable for high-frequency and high-speed use, instead of fluororesins, have been studied. Among them, the use of a polyphenylene ether resin having excellent dielectric properties among heat-resistant polymers has been attracting attentions. However, polyphenylene ether is also a thermoplastic resin having high melting temperature and high melt viscosity. Due to these problems, there are also many challenges in application, such as being difficult to achieve all electrical properties, flame retardancy and mechanical properties (such as heat resistance, chemical resistance, low moisture absorption, etc.) while meeting low dielectric loss tangent required for electronic components. In addition, the processability is poor during the manufacturing process, which will cause an increase in the scrap rate and a decrease in reliability.

In order to obtain circuit boards satisfying the development needs of modern electronic information technology, those skilled in the art have conducted a lot of research work, so as to expect achieving optimal performance in various performances, such as reliability, manufacturing processability and the like. But the effects are not satisfactory.

In addition, the materials for printed circuit boards used in electronic and electrical equipments are required to achieve a flame-retardant rating of 94V-0, which is no exception to high-frequency high-speed circuit board materials. At present, bromine-based halogen-containing materials are generally used as flame retardants in high-frequency high-speed circuit boards. Although halogen-containing materials have good flame-retardant effects, studies have shown that halogen-containing materials are prone to release irritating and toxic gases such as hydrogen halides and dioxins when burned, thereby jeopardizing human health. In some electronic products, it has been banned to use halogen-containing circuit board materials. In recent years, electronic materials used in electronic appliances tend to be halogen-free with the improvement of people's environmental protection concepts. Other types of flame retardants that can replace halogen-based flame retardants are sought to meet the requirements of flame retardancy. Although metal hydroxide flame retardants do not have the toxicity problem of the halogen-containing flame retardants, it is required to add a larger amount to obtain good flame-retardant performance due to poor flame retardant efficiency, which causes the resin to flow poorly during mixing and molding, so as to have worse processing and mechanical properties of the composite material. In addition, due to the large dielectric constant of the metal hydroxide, the use thereof as a flame retardant causes a decrease in the dielectric properties of the high-frequency circuit substrates. Phosphorus-containing flame retardants, which are mostly low-smoke and non-toxic, not only have good flame retardancy, but also can inhibit the release of smoke and toxic gases. Phosphorus-containing flame retardants meet the application requirements of low addition amount and obvious flame-retardant effect.

CN103709718A discloses a method for preparing a halogen-free high-frequency circuit board substrate, which uses polyphenylene ether as a main resin, alkyl-terminated diallyl bisphenol A as a curing agent, and adopts an additive-type bromine-containing or phosphorus-containing flame retardant. Among them, the additive-type phosphorus-containing flame retardant is used as a flame-retardant material for the production of high frequency copper clad laminates. However, the disclosed phosphorus-containing flame retardants have no reactive groups and do not participate in cross-linking between the resin molecules of composite materials. These kinds of phosphorus-containing flame retardants have very low melting point (less than 200° C.). Thus, the high-frequency circuit substrate material produced therefrom has poor heat resistance and cannot meet the requirements of high-temperature soldering reliability in subsequent assembly of circuit board components.

CN106543228A discloses a resin having the following structure:

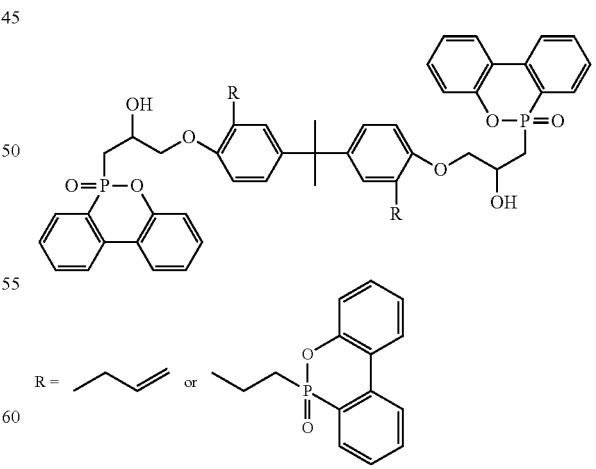

However, the dielectric properties of the prepared copper clad laminate may not be satisfactory due to the presence of hydroxyl polar groups in the structure, if such resin is applied to the preparation of copper clad laminates.

CN106366128 discloses a phosphine compound having the following structure:

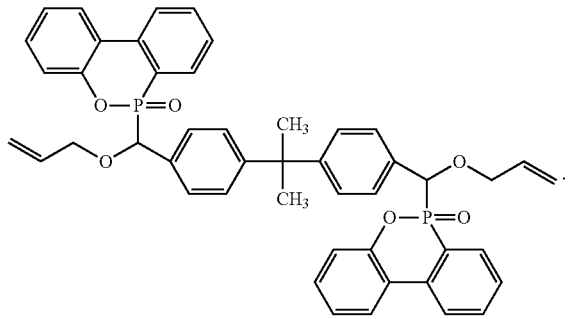 [SMILES: C=CCOC(c1ccc(C(C)(C)c2ccc(C(OCC=C)P3(=O)Oc4ccccc4-c4ccccc43)cc2)cc1)P1(=O)Oc2ccccc2-c2ccccc21]

However, if the compound is used in the preparation of copper clad laminates, a rearrangement reaction occurs during processing due to the allyl ether structure present in the structure, resulting in the production of secondary hydroxyl polar groups, which also causes that the prepared copper clad laminate cannot meet the requirements of dielectric properties.

Therefore, it is desired in the art to develop a thermosetting resin composition which can ensure good flame retardancy and can achieve good effects in various aspects such as dielectric properties and heat resistance.

DISCLOSURE OF THE INVENTION

In view of the deficiencies of the prior art, the object of the present invention is to provide a thermosetting resin composition, a prepreg, a metal foil-clad laminate, and a high-frequency circuit board prepared therefrom. The thermosetting resin composition of the present invention contains no polar groups (such as hydroxyl groups), has low molecular polarity and high reactivity, lowers the dielectric constant and loss of the cured product, and ensures good flame retardancy, good mechanical strength and good high temperature resistance of the cured product.

In order to achieve the object of the present invention, the present invention discloses the following technical solutions.

On the first aspect, the present invention provides a thermosetting resin composition, comprising thermosetting ingredients which comprise a phosphorus-containing monomer or a phosphorus-containing resin and a polyphenylene ether resin containing unsaturated groups, wherein the phosphorus-containing monomer or the phosphorus-containing resin has a structure as shown in Formula I:

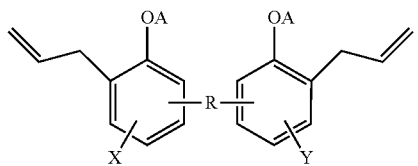

Formula I wherein R represents a linear or branched alkyl,

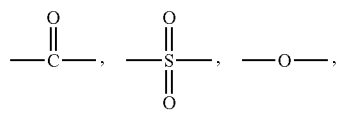

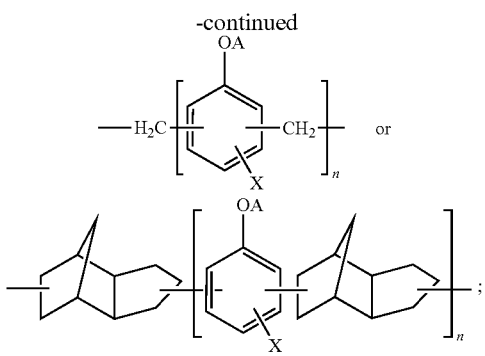

X and Y are independently selected from the group consisting of hydrogen, allyl, linear alkyl, branched alkyl, and a combination of at least two selected therefrom; A is a phosphorus-containing capping group; and n is an integer of 1-20.

In the thermosetting resin composition of the present invention, the phosphorus-containing monomer or the phosphorus-containing resin has a characteristic of low polarity. The low polarity means that it contains no polar groups, particularly no hydroxyl groups, so as to make the resin have a lower polarity, and to overcome the defects of high frequency dielectric constant and high loss due to high polarity of general thermosetting resins. Meanwhile, cross-linking curing could be realized through the allyl structure in the structure to ensure the mechanical strength after curing and to make the cured product have excellent heat resistance. At the same time, the resin contains a flame-retardant phosphorus-containing structure, so as to have a good intrinsic flame-retardant effect.

In the present invention, the phosphorus-containing monomer or the phosphorus-containing resin can well cooperate with the polyphenylene ether resin containing unsaturated groups to improve the high temperature resistance and the moist-heat resistance of the resin composition. While having better flame retardancy, the cured product prepared from the resin composition has good heat resistance and dielectric properties.

Preferably, R is C1-C6 (e.g. C1, C2, C3, C4, C5 or C6) linear alkyl or C3-C6 (e.g. C3, C4, C5 or C6) branched alkyl, specifically —CH$_2$—,

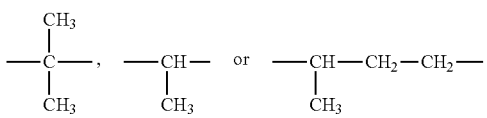

and the like.

Preferably, R represents —CH$_2$—,

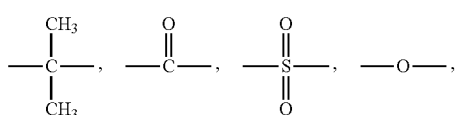

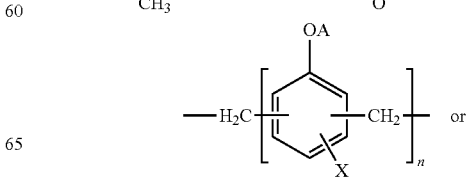

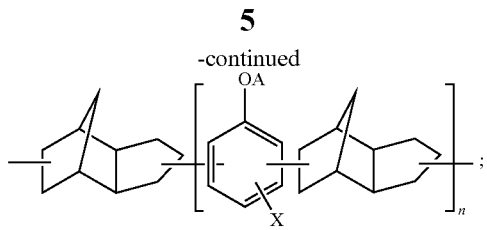

n is an integer of 1-20; X and Y are independently selected from the group consisting of hydrogen, allyl, linear alkyl, branched alkyl, and a combination of at least two selected therefrom; and A is a phosphorus-containing capping group.

In the present invention, n is an integer of 1-20, e.g. 1, 2, 3, 4, 5, 6, 7, 8, 9, 10, 11, 12, 13, 14, 15, 16, 17, 18, 19 or 20.

Preferably, X and Y are independently C1-C21 (e.g. C1, C2, C3, C4, C5, C6, C7, C8, C9, C10, C11, C12, C13, C14, C15, C16, C17, C18, C19, C20 or C21) linear alkyl or C3-C21 (e.g. C3, C4, C5, C6, C7, C8, C9, C10, C11, C12, C13, C14, C15, C16, C17, C18, C19, C20 or C21) branched alkyl.

Preferably, A is a DOPO-containing group, preferably anyone selected from the group consisting of

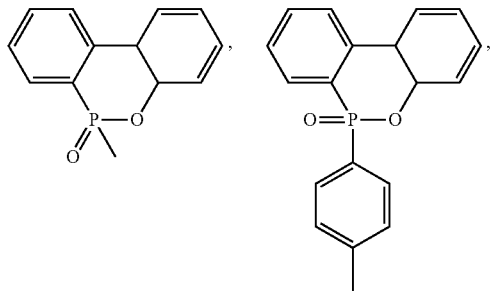

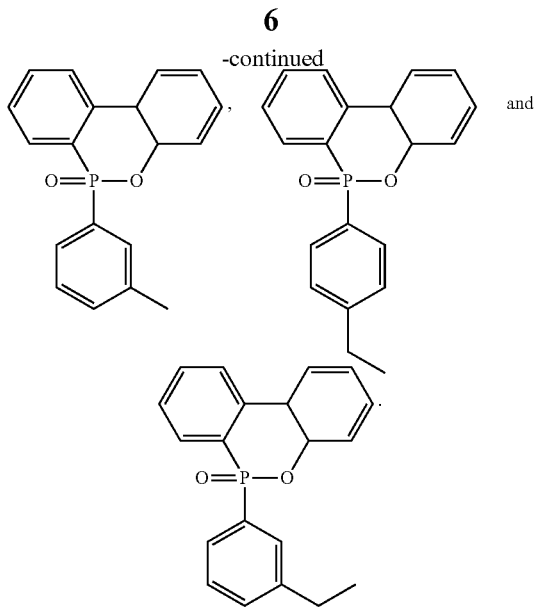

Preferably, the phosphorus-containing monomer or the phosphorus-containing resin is a phosphorus-containing monomer or a phosphorus-containing resin having a phosphorus content greater than 3%, more preferably greater than 5%, further preferably greater than 8%. The higher the phosphorus content is, the better flameretardancy the thermosetting resin composition is provided with.

Preferably, the phosphorus-containing monomer or the phosphorus-containing resin is anyone selected from the group consisting of the compounds having the following structures of Formulae A-D, and a combination of at least two selected therefrom:

Formula A

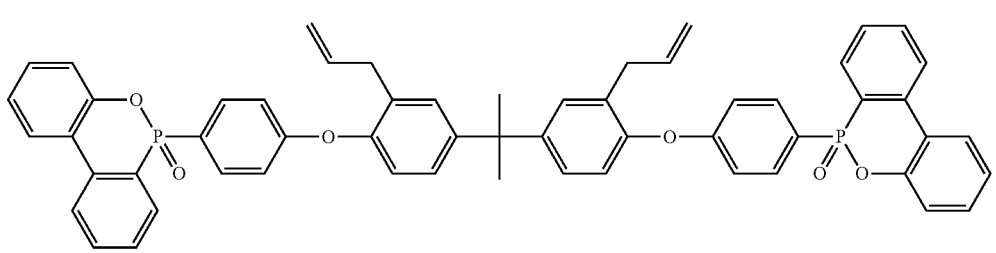

Formula B

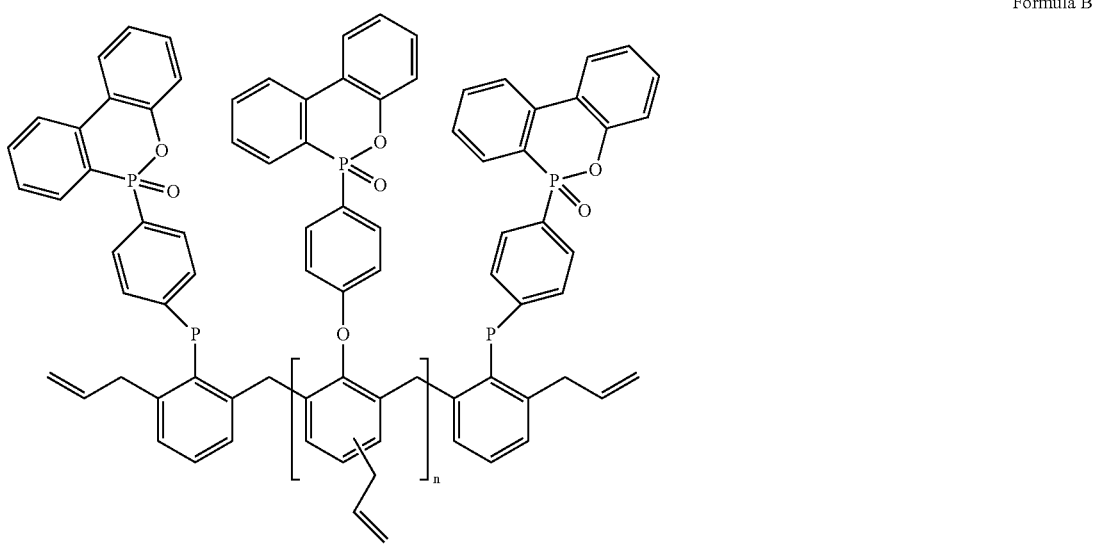

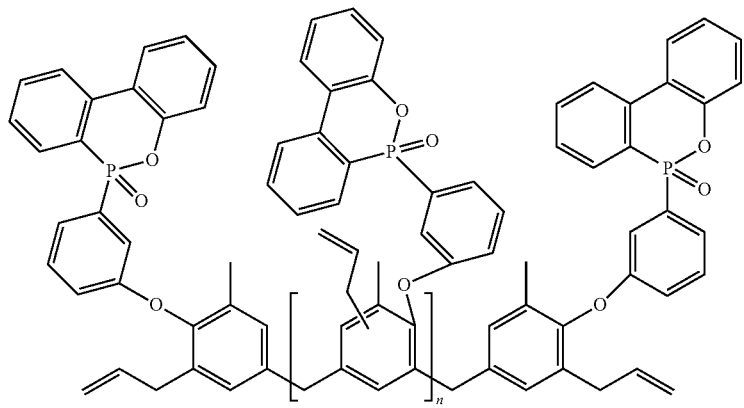

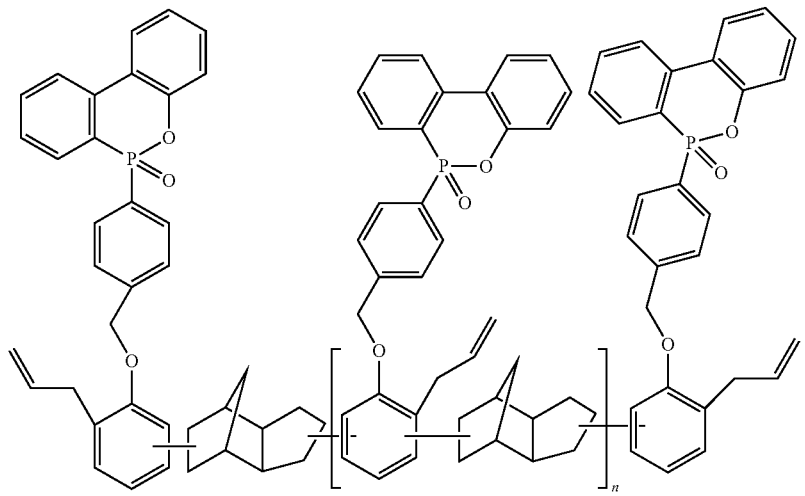

wherein n is an integer of 1-20.

Preferably, the phosphorus-containing monomer or the phosphorus-containing resin is prepared by the following method comprising the steps of:

(1) a phenolic compound or a phenolic resin of Formula II is reacted with an allylation reagent to obtain an allyl etherified resin of Formula III, wherein the exemplary reaction formula is as follows:

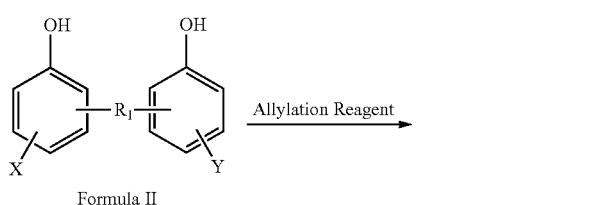

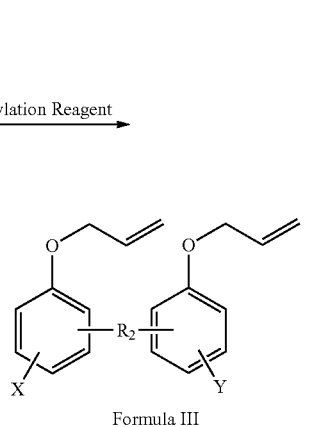

(2) the allyl etherified resin of Formula III is heated under the protection of protective gas, and an intramolecular rearrangement reaction occurs to obtain an allylated phenolic resin of Formula IV:

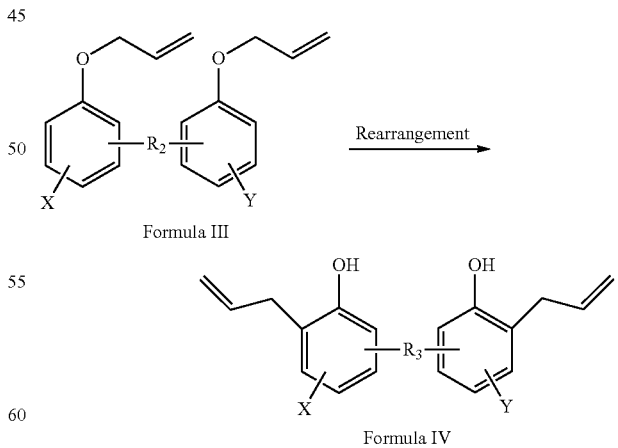

(3) the allylated phenolic resin of Formula IV is reacted with a phosphorus-containing capping reagent to obtain the phosphorus-containing monomer or the phosphorus-containing resin of Formula I:

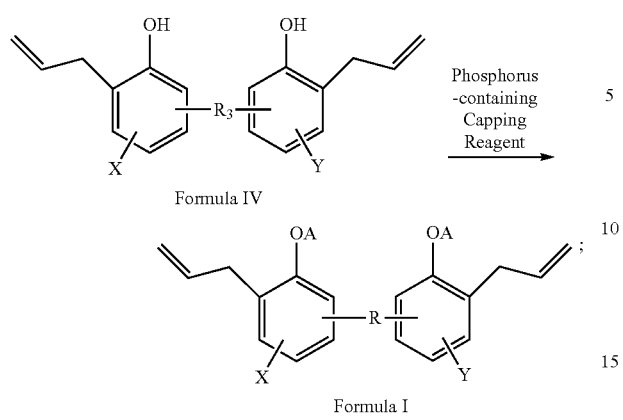

Formula IV → Formula I wherein $R_1$ is selected from the group consisting of linear or branched alkyl,

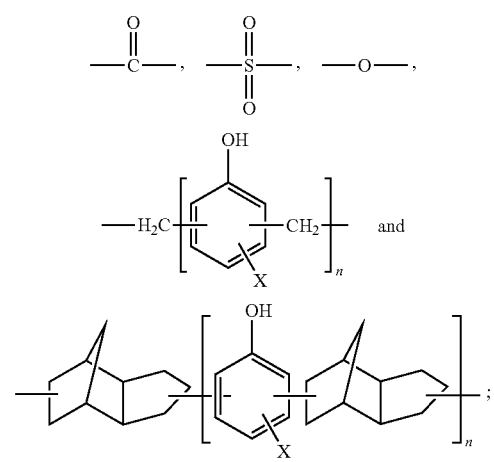

$R_2$ is selected from the group consisting of linear or branched alkyl,

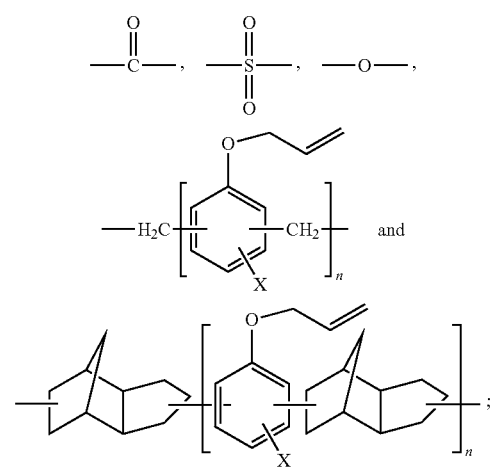

$R_3$ is selected from the group consisting of linear or branched alkyl,

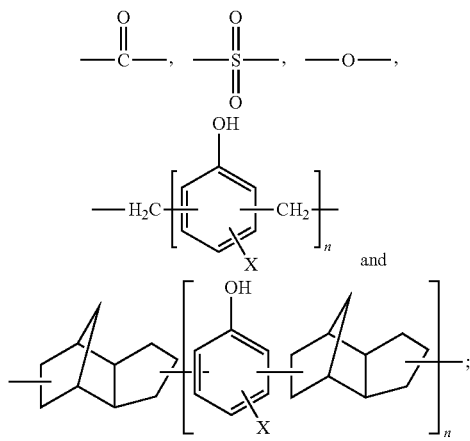

R is selected from the group consisting of linear or branched alkyl,

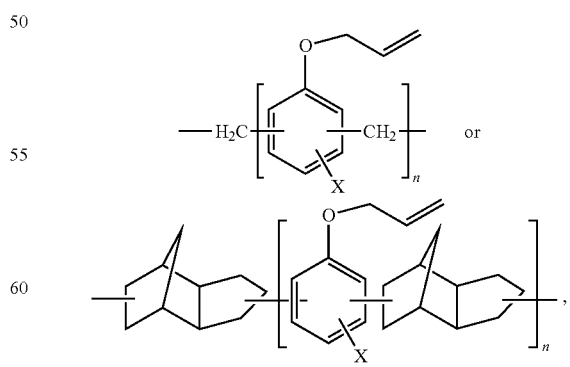

X and Y are independently selected from the group consisting of hydrogen, allyl, linear alkyl, branched alkyl, and a combination of at least two selected therefrom; A is a phosphorus-containing capping group; and n is an integer of 1-20.

In the rearrangement in step (2) of the present invention, when $R_2$ is the rearrangement of the allyl ether group therein will occur, resulting in that the intermediate unit $R_3$ of the allylated phenolic resin represented by Formula IV contains allyl groups generated by rearrangement, and further that the unit R in the phosphorus-containing monomer or the phosphorus-containing resin represented by Formula I contains allyl groups generated by rearrangement. For simplicity of expression, the allyl group is not directed represented in the corresponding structures of $R_3$ and R. Only X is used to represent all the substituents on the benzene ring. However, it is clear here that X contains allyl groups generated by rearrangement. If $R_2$ is

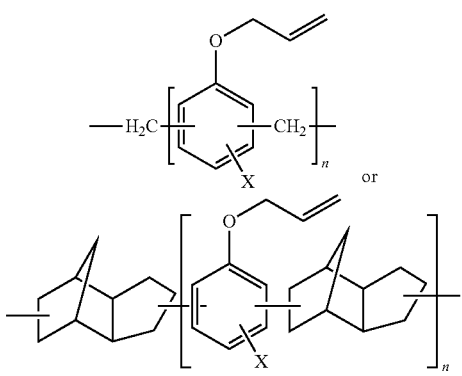

before the rearrangement reaction, and there are other substituents X on the benzene ring, X in the structure of

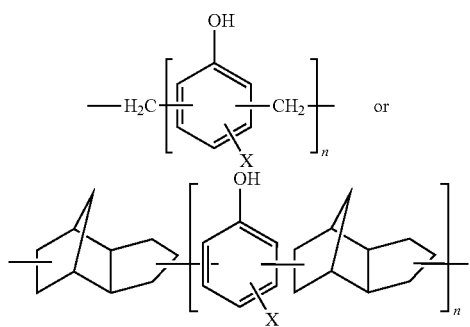

of $R_3$, after rearrangement of step (2), may represent the combination of allyl groups generated by rearrangement and other substituents before the reaction. In the rearrangement step of step (2), there certainly comprises the circumstance that no rearrangement of allyl ether group in unit $R_2$ occurs when $R_2$ represents

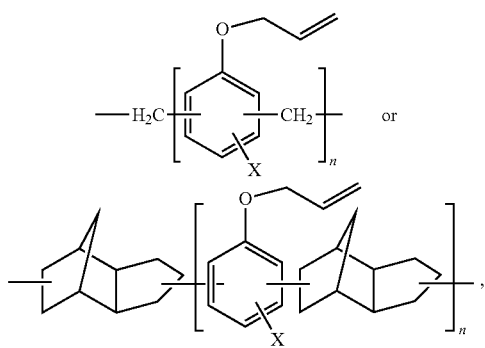

At this time, X in $R_3$ and the product R after the reaction is the same as group X in $R_2$ of the allyl etherified resin represented by Formula III before the reaction.

Preferably, the phenolic compound or phenolic resin in step (1) is phenol, dihydric phenol, polyhydric phenol or derivatives thereof, preferably anyone selected from the group consisting of phenol, o-cresol, bisphenol A, bisphenol F, tetramethyl bisphenol A, phenol resin, o-cresol novolac resin, cyclopentadiene novolac resin, and a combination of at least two selected therefrom.

Preferably, the allylation reagent is anyone selected from the group consisting of allyl silanol, allyl chloride, allyl bromide, allyl iodide, allylamine, and a combination of at least two selected therefrom.

Preferably, the molar ratio of the phenolic hydroxyl groups in the phenolic compound or phenolic resin to the allyl groups in the allylation reagent is 1: (0.3-1.2), e.g. 1:0.3, 1:0.4, 1:0.5, 1:0.6, 1:0.7, 1:0.8, 1:0.9, 1:1, 1:1.1 or 1:1.2.

Preferably, the reaction in step (1) is carried out in the presence of a basic substance which is preferably anyone selected from the group consisting of sodium hydroxide, potassium hydroxide, sodium carbonate, potassium carbonate, and a combination of at least two selected therefrom.

Preferably, the molar ratio of the basic substance to the phenolic hydroxyl groups contained in the phenolic compound or phenolic resin in step (1) is (0.3-1.4) : 1, e.g. 0.3:1, 0.4:1, 0.5:1, 0.6:1, 0.7:1, 0.8:1, 0.9:1, 1:1, 1.1:1, 1.2:1, 1.3:1 或 1.4:1.

Preferably, the reaction in step (1) is carried out in the presence of a phase transfer catalyst.

Preferably, the phase transfer catalyst is quaternary-ammonium-salt phase transfer catalysts, preferably anyone selected from the group consisting of tetrabutylammonium chloride, tetrabutylammonium bromide, benzyltriethylammonium chloride, tetrabutylammonium hydrogen sulfate, trioctylmethylammonium chloride, dodecyltrimethylammonium chloride, tetradecylbromotrimethylammonium chloride, and a combination of at least two selected therefrom.

Preferably, the phase transfer catalyst is added in an amount of 0.1 to 5%, e.g. 0.1%, 0.3%, 0.5%, 0.8%, 1%, 1.3%, 1.5%, 1.8%, 2%, 2.3%, 2.5%, 2.8%, 3%, 3.3%, 3.5%, 3.8%, 4%, 4.3%, 4.5%, 4.8% or 5%, by mass of the phenolic compound or phenolic resin of step (1).

Preferably, the solvent of the reaction in step (1) is anyone selected from the group consisting of alcohol solvents, aromatic hydrocarbon solvents, ketone solvents, and a combination of at least two selected therefrom, preferably anyone selected from the group consisting of ethanol, propanol, butanol, toluene, xylene, and a combination of at least two selected therefrom.

Preferably, the solvent is added in an amount of 2-5 times, e.g. 2, 2.3, 2.5, 2.8, 3, 3.3, 3.5, 3.8, 4, 4.3, 4.5, 4.8 or 5, the mass of the phenolic compound or phenolic resin in step (1).

Preferably, the temperature of the reaction in step (1) is 60-90° C., e.g. 60° C., 63° C., 65° C., 68° C., 70° C., 75° C., 78° C., 80° C., 85° C., 88° C. or 90° C.

Preferably, the reaction in step (1) lasts for 4-6 hours, e.g. 4, 4.3, 4.5, 4.8, 5, 5.2, 5.5, 5.8 or 6 hours.

Preferably, the protective gas in step (2) is nitrogen gas or argon gas.

Preferably, the heat treatment in step (2) refers to heating to 180-220° C., e.g. 180° C., 185° C., 190° C., 195° C., 200° C., 205° C., 210° C., 215° C. or 220° C.

Preferably, the reaction in step (2) lasts for 4-6 hours, e.g. 4, 4.3, 4.5, 4.8, 5, 5.2, 5.5, 5.8 or 6 hours.

Preferably, the phosphorus-containing capping reagent in step (3) is anyone selected from the group consisting of 9,10-dihydro-9-oxa-10-phosphaphenanthrene-10-oxide, 2-(6H-dibenzo(c,e)(1,2)-5-oxa-6-phosphono-6-phenyl-1,4-hydroquinone, 2-(6H-dibenzo-(c,e)(1,2)-5-oxa-6-phosphono-6-phenyl-4-phenol, 2-(6H-dibenzo(c,e)-(1,2)-5-oxa-6-phosphono-6-phenyl-3-phenol, 2-(6H-dibenzo(c,e)(1,2)-5-oxa-6-phosphono-6-phenyl-4-benzyl alcohol, 2-(6H-dibenzo(c,e)(1,2)-5-oxa-6-phosphono-6-phenyl-3-benzyl alcohol, and a combination of at least two selected therefrom.

Preferably, the molar ratio of the phenolic hydroxyl groups in the allylated phenolic resin of Formula IV to the phosphorus-containing capping groups in the phosphorus-containing capping reagent in step (3) is 1: (1-1.2), e.g. 1:1, 1:1.05, 1:1.1, 1:1.15 or 1:1.2, so that the phenolic hydroxyl groups in the molecular structure of the resin obtained by the reaction are completely terminated by the phosphorus-containing capping groups, to make the resin contain no polar hydroxyl groups.

Preferably, the reaction in step (3) is carried out in the presence of a basic substance.

Preferably, the basic substance is an inorganic base or an organic base, preferably anyone selected from the group consisting of sodium hydroxide, potassium hydroxide, sodium carbonate, potassium carbonate, triethylamine, pyridine, or a combination of at least two selected therefrom.

Preferably, the molar ratio of the basic substance to the phenolic hydroxyl groups in the allylated phenolic resin of Formula IV is (1-1.4):1, e.g. 1:1, 1.05:1, 1.1:1, 1.15:1, 1.2:1, 1.25:1, 1.3:1, 1.35:1 or 1.4:1.

Preferably, the reaction in step (3) lasts for 4-6 hours, e.g. 4, 4.3, 4.5, 4.8, 5, 5.2, 5.5, 5.8 or 6 hours.

The resin prepared by the method of the present invention does not contain polar hydroxyl groups, and has stable molecular structure, low molecular polarity and high reactivity. There is no polar hydroxyl groups generated during the application process thereof, thereby avoiding the effect of secondary hydroxyl groups generated therefrom on the properties of its products. Moreover, the termination with a phosphorus-containing capping group imparts intrinsic flame retardancy to the resin composition.

In the present invention, the phosphorus-containing monomer or the phosphorus-containing resin has a small content of impurities or by-products, which may provide the thermosetting resin composition with better dielectric properties and heat resistance. Preferably, the phosphorus-containing monomer or the phosphorus-containing resin has a dielectric loss tangent of 0.0025 (1 GHz) or less.

Preferably, the polyphenylene ether resin containing unsaturated groups is a polyphenylene ether resin containing double bonds or triple bonds, preferably anyone selected from the group consisting of allyl-terminated polyphenylene ether resin, acrylate-terminated polyphenylene ether resin, vinyl-terminated polyphenylene ether resin, and a combination of at least two selected therefrom, further preferably acrylate-terminated polyphenylene ether resin, further preferably SA9000 resin, OPE-ST-1200 resin or OPE-ST-2200 resin.

In the present invention, the polyphenylene ether resin containing unsaturated groups has a structure represented by the following Formula (1) or (2):

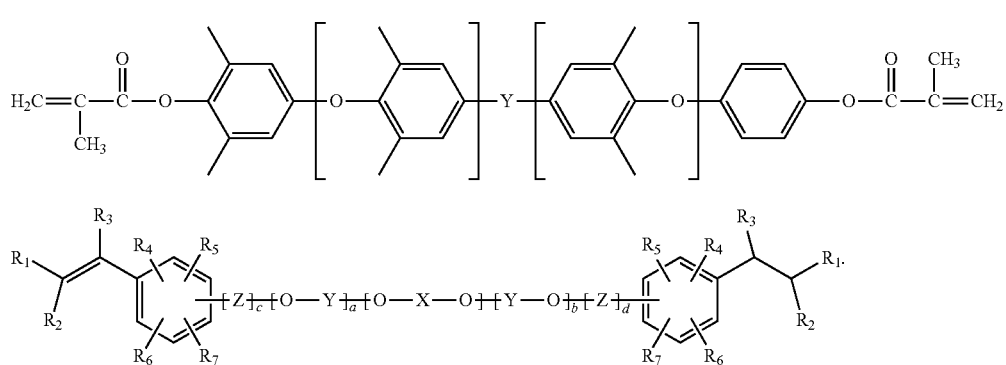

Formula (1)

Formula (2)

Preferably, the reaction in step (3) is carried out in the presence of carbon tetrachloride.

Preferably, the molar ratio of carbon tetrachloride to the phenolic hydroxyl groups in the allylated phenolic resin of Formula IV in step (3) is (1-2):1, e.g. 1:1, 1.1:1, 1.2:1, 1.3:1, 1.4:1, 1.5:1, 1.6:1, 1.7:1, 1.8:1, 1.9:1 or 2:1.

Preferably, the solvent of the reaction in step (3) is halogenated hydrocarbon solvents, preferably anyone selected from the group consisting of monochloromethane, dichloromethane, chloroform, dichloroethane, and a combination of at least two selected therefrom.

Preferably, the solvent is added in an amount of 2-5 times, e.g. 2, 2.3, 2.5, 2.8, 3, 3.3, 3.5, 3.8, 4, 4.3, 4.5, 4.8 or 5, the mass of the allylated phenolic resin of step (3).

Preferably, the temperature of the reaction in step (3) is 0-30° C., e.g. 0° C., 3° C., 5° C., 8° C., 10° C., 15° C., 18° C., 20° C., 25° C., 28° C. or 30° C., preferably 10° C.

Preferably, the polyphenylene ether resin containing unsaturated groups has a number average molecular weight (converted by using polystyrene measured by gel permeation chromatography) of 700-8,000, e.g. 700, 900, 1200, 1500, 2000, 3000, 4000, 5000, 6000, 7000 or 8000, more preferably 900-5,000, further preferably 1,000-3,500. In the present invention, the polyphenylene ether resin containing unsaturated groups (such as double bonds, triple bonds) has good reactivity, and controlling a suitable molecular weight can provide good solubility and low melt viscosity, which is advantageous for subsequent impregnation process operation and lamination flow and can also provide glue-filling ability in the processing of multilayer circuit boards.

In the present invention, the phosphorus-containing monomer or the phosphorus-containing resin may be used as a crosslinking agent of the above-mentioned polyphenylene ether resin containing unsaturated groups for crosslinking and curing the above polyphenylene ether resin containing unsaturated groups.

Preferably, the thermosetting ingredients account for 5 to 90% by weight of the thermosetting resin composition, e.g. 5%, 8%, 10%, 15%, 18%, 20%, 25%, 30%, 40%, 50%, 60%, 70%, 80% or 90%.

Preferably, the phosphorus-containing monomer or the phosphorus-containing resin accounts for 20 to 75%, e.g. 20%, 25%, 30%, 35%, 40%, 45%, 50%, 55%, 60%, 65%, 70% or 75%, of the total weight of the polyphenylene ether resin containing unsaturated groups and the phosphorus-containing monomer or the phosphorus-containing resin.

Preferably, the thermosetting resin composition further comprises a powder filler in an amount of from 0% to 50% by weight of the thermosetting resin composition, e.g. 0%, 1%, 5%, 10%, 20%, 30%, 40% or 50%.

Preferably, the powder filler is anyone selected from the group consisting of crystalline silica, molten silica, spherical silica, titanium dioxide, strontium titanate, barium titanate, barium strontium titanate, zinc silicate, magnesium silicate, aluminium nitride, boron nitride, silicon nitride, silicon carbide, aluminum oxide, magnesium oxide, zirconium oxide, beryllium oxide, aluminum hydroxide, magnesium hydroxide, kaolin, talc, hydrotalcite, calcium silicate, stripping powder, melting silicon micropowder, clean silicon micropowder, spherical silicon micropowder, zinc borate, mullite, rutile titanium dioxide, anatase titanium dioxide, hollow glass microspheres, potassium titanate fiber, polytetrafluoroethylene powder, polyphenylene sulfide powder, benzene ethylene powder, glass fiber, polytetrafluoroethylene, polyphenylene sulfide, polyether sulfone, and a combination of at least two selected therefrom. The above fillers may be used singly or in combination, wherein the optimum filler is silica, and silica fillers such as CE44I (CE minerals), FB-35 (Denka), 525 (Sibelco) may be used.

Preferably, the powder filler has a median particle diameter of 1-15 μm, e.g. 1 μm, 3 μm, 5 μm, 7 μm, 9 μm, 10 μm, 12 μm or 15 μm, preferably 1-10 μm. The filler having a particle diameter within such range has a better dispersibility.

Preferably, the thermosetting resin composition further comprises a curing initiator.

The curing initiator is selected from materials that generate free radicals. The curing initiator functions to accelerate the curing crosslinking reaction. When the thermosetting resin composition of the present invention is heated, the curing initiator decomposes to generate free radicals, causing crosslinking of the molecular chains of the thermosetting resin and the phosphorus-containing crosslinking agent.

Preferably, the curing initiator is used in an amount of 0.3-6%, e.g. 0.3%, 0.5%, 0.8%, 1%, 2%, 3%, 4%, 5% or 6%, by mass of the thermosetting resin composition.

Preferably, the curing initiator is anyone selected from the group consisting of benzoyl peroxide, dicumyl peroxide, tert-butyl peroxybenzoate, 2,5-di(2-ethylhexanoyl peroxy)-2,5-dimethyl hexane, and a combination of at least two selected therefrom. Although the above curing initiators are exemplified, it is not limited to the materials listed above. Any material capable of generating free radicals can be used as a curing initiator.

Preferably, the thermosetting resin composition further comprises a co-crosslinking agent comprising a monomer or a low-molecular copolymer having unsaturated double bonds or unsaturated triple bonds in the molecular structure. In the present invention, a certain amount of co-crosslinking agent may be added to increase the crosslinking density.

Preferably, the co-crosslinking agent is anyone selected from the group consisting of triallyl tripolyisocyanurate, triallyl tripolycyanurate, divinylbenzene, polyfunctional acrylate, bismaleimide, and a combination of at least two selected therefrom.

Preferably, the thermosetting resin composition further comprises other thermosetting resins, preferably resin materials having unsaturated double bonds or unsaturated triple bonds, further preferably anyone selected from the group consisting of cyanate resin, polybutadiene resin, bismaleimide resin, vinyl-terminated silicone resin, and a combination of at least two selected therefrom. Said other thermosetting resins are not limited to the resins listed above.

On the second aspect, the present invention provides a resin varnish obtained by dissolving or dispersing the thermosetting resin composition of the present invention in a solvent.

Preferably, the solvent is anyone selected from the group consisting of ketones, hydrocarbons, ethers, esters, aprotic solvents, and a combination of at least two selected therefrom, preferably anyone selected from the group consisting of acetone, methyl ethyl ketone, methyl isobutyl ketone, toluene, xylene, methanol, ethanol, primary alcohol, ethylene glycol monomethyl ether, propylene glycol monomethyl ether, propylene glycol methyl ether acetate, ethyl acetate, N,N-dimethylformamide, N,N-diethyl formamide, and a mixture of at least two selected therefrom. The solvent may be used singly or in combination. The amount of the solvent to be added can be determined by those skilled in the art according to the viscosity of the resin to be selected, so that the viscosity of the resin glue is moderate to facilitate the curing. The present invention makes no limitations on such aspect.

On the third aspect, the present invention provides a prepreg comprising a reinforcing material and the thermosetting resin composition above which is adhered thereto after impregnation and drying.

In the present invention, the reinforcing material is a woven fiber cloth, preferably woven glass fiber cloth, such as E-glass fiberglass cloth, NE-glass fiberglass cloth, Q-glass fiberglass cloth, etc., including 7628 type, 2116 type, 1080 type, 106 type, 104 type. The commercially available glass cloth specifications and models can be used for the production of the resin composition of the present invention, and the models are not limited to the above-mentioned ones. The woven fiber cloth may further include an organic fiber woven fabric, and examples thereof include PTFE fiber cloth, aramid fiber woven cloth and the like.

On the fourth aspect, the present invention provides a laminate comprising at least one prepreg above.

On the fifth aspect, the present invention provides a metal foil-clad laminate comprising one or at least two laminated prepregs above, and metal foil on one side or both sides of the laminated prepreg.

On the sixth aspect, the present invention provides a high-frequency circuit board comprising one or at least two laminated prepregs above.

In the present invention, the metal foil-clad laminate can be exemplarily prepared by laminating a plurality of sheets of the above-mentioned prepregs, pressing a sheet of copper foil on each of the upper and lower sides, and then putting them into a press for curing to obtain the metal foil-clad laminate. The curing temperature of this step ranges from 150° C. to 300° C. (such as 150° C., 160° C., 180° C., 200° C., 230° C., 250° C., 280° C. or 300° C.); the curing pressure ranges from 25 to 70 kg/cm$^2$ (e.g. 25 kg/cm$^2$, 30 kg/cm$^2$, 35 kg/cm$^2$, 40 kg/cm$^2$, 50 kg/cm$^2$, 60 kg/cm$^2$ or 70 kg/cm$^2$).

As compared with the prior art, the present invention has the following beneficial effects.

(1) The resin of the present invention contains no polar hydroxyl groups, and has a stable molecular structure, a low molecular polarity and a high reactivity. It does not generate polar hydroxyl groups during the application process thereof, thereby avoiding the effect of the generated secondary hydroxyl groups on the properties of the product. Therefore, the resin still has crosslinkable reactive groups while improving the dielectric properties, so that the high temperature resistance after curing does not change significantly. The introduction of phosphorus-containing capping groups makes the resin have intrinsic flame-retardant properties. In addition, the phosphorus-containing monomer or the phosphorus-containing resin has good solubility and low melt viscosity, giving the thermosetting resin composition better processability.

(2) The use of a phosphorus-containing monomer or a phosphorus-containing resin having excellent dielectric properties as a component of the thermosetting resin composition can impart good dielectric properties to the thermosetting resin composition. In addition, the phosphorus-containing monomer or the phosphorus-containing resin can be used as a crosslinking agent for the polyphenylene ether resin containing unsaturated groups for crosslinking and curing the above-mentioned polyphenylene ether resin containing unsaturated groups, so as to provide high frequency dielectric properties and high temperature resistance required by circuit boards by crosslinking a large amount of unsaturated double bonds in the resin.

(3) It is relatively easy to prepare a prepreg by using the thermosetting resin composition of the present invention. The laminate or metal foil-clad laminate produced therefrom has low dielectric constant and dielectric loss tangent, and is easy to handle. Thus, the composite material of the present invention is suitable for manufacturing circuit boards for high frequency electronic devices.

Embodiments

The technical solutions of the present invention will be further described below by specific embodiments. It should be understood by those skilled in the art that the examples are merely used for understanding the present invention, rather than any specific limitations to the present invention.

The sources of the components of the resin composition selected in the examples of the present invention are listed in Table 1 as follows:

TABLE 1

| Manufacturer | Product name or brand | Material contents |
|---|---|---|
| sabic | SA9000 | Acrylate-terminated polyphenylene ether |
| Mitsubishi Gas | OPE-ST-1200 | Vinyl-terminated polyphenylene ether |
| Self-made | Phosphorus-containing esterified diallyl bisphenol A | |
| Self-made | Phosphorus-containing esterified allyl phenolic resin | |
| Self-made | Phosphorus-containing esterified allyl o-cresol novolac resin | |
| Sibelco | 525 | Silica micropowder |
| Shanghai Gaoqiao | DCP | Dicumyl peroxide |
| Shanghai Honghe | 1080 glass fiber cloth | Having a thickness of 0.05 mm, and a basis weight of 48 g/m² |

PREPARATION EXAMPLE 1

188 g of acetone was added to a three-necked reaction flask. 228 g of bisphenol A was then added to the reaction flask, stirred and dissolved, and 106 g of sodium carbonate was added. 153 g of a chloropropene solution was slowly added dropwise, and then the reaction was stopped after raising the temperature for 4 hours. Filtration, removal of most of the solvent and washing were carried out, and then removal of residual solvent and water gave bisphenol A diallyl ether.

134 g of the prepared bisphenol A diallyl ether was placed in the reaction flask, and subjected to a rearrangement reaction by heating for 6 hours. The mixture was cooled to obtain a brown viscous liquid, i.e. diallyl bisphenol A.

An inert gas was introduced into the three-necked reaction flask for protection. 300 g of dichloromethane was added. 134 g of the prepared diallyl bisphenol A was placed in the reaction flask, stirred and dissolved. 40 g of sodium hydroxide was added, and 152 g of carbon tetrachloride was added. 230 g of 2-(6H-dibenzo(c,e)(1,2)-5-oxa-6-phosphono-6-phenyl-4-phenol was slowly added dropwise, and the reaction was stopped after reacting for 4 hours. An aqueous solution of sodium hydroxide was added to wash to neutrality, then washing was conducted several times to remove residual solvent and water, thereby obtaining phosphorus-containing esterified diallyl bisphenol A, i.e. the low-polarity intrinsic flame-retardant resin having the structure thereof as follows:

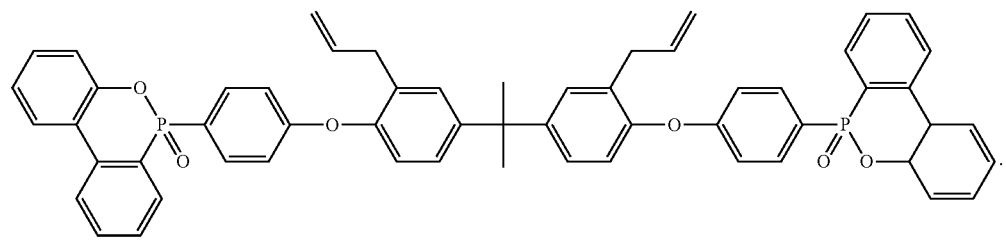 [SMILES: C=CCc1cc(C(C)(C)c2ccc(Oc3ccc(P4(=O)OC5C=CC=CC5c5ccccc54)cc3)c(CC=C)c2)ccc1Oc1ccc(P2(=O)Oc3ccccc3-c3ccccc32)cc1]

PREPARATION EXAMPLE 2

300 g of n-butanol was added to a three-necked reaction flask. 114 g of linear phenolic resin was then added to the reaction flask, stirred and dissolved, and 56 g of potassium hydroxide was added. 153 g of a bromopropane solution was slowly added dropwise, and then the reaction was stopped after raising the temperature for 4 hours. Filtration, removal of most of the solvent and washing were carried out, and then removal of residual solvent and water gave an allyl etherified phenolic resin.

141 g of the prepared allyl etherified phenolic resin was placed in the reaction flask, and subjected to a rearrangement reaction by heating for 4 hours. The mixture was cooled to obtain a brown viscous liquid, i.e. allyl phenolic resin.

An inert gas was introduced into the three-necked reaction flask for protection. 350 g of dichloromethane was added. 141 g of the prepared allyl phenolic resin was placed in the reaction flask, stirred and dissolved. 72 g of triethylamine was added, and 152 g of carbon tetrachloride was added. 230 g of 2-(6H-dibenzo(c,e)(1,2)-5-oxa-6-phosphono-6-phenyl-4-phenol was slowly added dropwise, and the reaction was stopped after reacting for 4 hours. An aqueous solution of sodium hydroxide was added to wash to neutrality, then washing was conducted several times to remove residual solvent and water, thereby obtaining phosphorus-containing esterified allyl phenolic resin, i.e. the low-polarity intrinsic flame-retardant resin having Mn of 1,300 and the structure thereof is as follows:

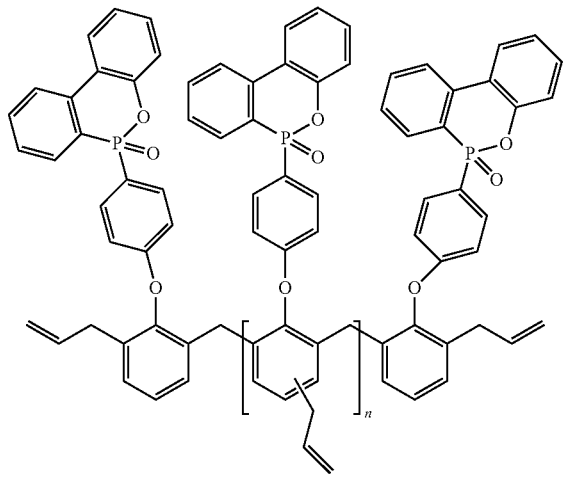

PREPARATION EXAMPLE 3

250 g of toluene was added to a three-necked reaction flask. 118 g of o-cresol novolac resin was then added to the reaction flask, stirred and dissolved, and 100 g of an aqueous solution of sodium hydroxide (having a concentration of 40%) was added, and then 1g of tetrabutylammonium bromide was further added. After the temperature became constant, 153g of a chloropropene solution was slowly added dropwise. The reaction was stopped after raising the temperature for 4 hours. Washing and removal of the solvent were carried out to obtain allyl etherified o-cresol novolac resin.

159g of the prepared allyl etherified o-cresol novolac resin was placed in the reaction flask, and subjected to a rearrangement reaction by heating for 4 hours. The mixture was cooled to obtain a dark brown semisolid, i.e. allyl o-cresol novolac resin.

An inert gas was introduced into the three-necked reaction flask for protection. 350 g of dichloromethane was added. 159 g of the prepared allyl o-cresol novolac resin was placed in the reaction flask, stirred and dissolved. 103 g of pyridine was added, and 152 g of carbon tetrachloride was added. 230 g of 2-(6H-dibenzo(c,e)(1,2)-5-oxa-6-phosphono-6-phenyl-3-phenol was slowly added dropwise, and the reaction was stopped after reacting for 4 hours. An aqueous solution of sodium hydroxide was added to wash to neutrality, then washing was conducted several times to remove residual solvent and water, thereby obtaining phosphorus-containing esterified allyl o-cresol novolac resin, i.e. the low-polarity intrinsic flame-retardant resin having Mn of 1,200 and the structure thereof is as follows:

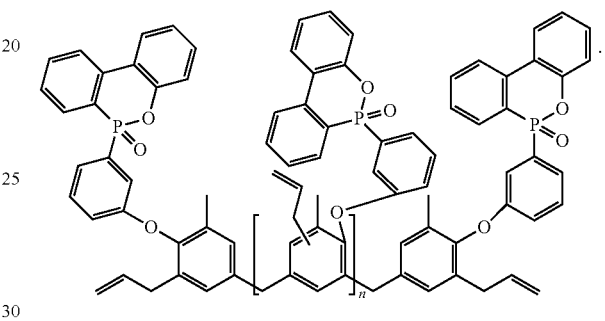

EXAMPLE 1

80 parts by weight of SA9000, 20 parts by weight of phosphorus-containing esterified diallyl bisphenol A prepared in Preparation Example 1, 85 parts by weight of silica (525), and 6.5 parts by weight of an initiator DCP were mixed, adjusted to a suitable viscosity with a solvent of toluene, stirred and uniformly mixed to uniformly disperse the filler in the resin, so as to obtain a varnish. 1080 glass fiber cloth was impregnated with the varnish above, and then dried to remove the solvent to obtain a prepreg. Eight sheets of prepared prepregs were laminated, and pressed on both sides thereof with copper foils having a thickness of 1 oz (ounce), and cured in a press for 2 hours at a curing pressure of 50 kg/cm$^2$ and a curing temperature of 190° C. The physical property data are shown in Table 2 below.

EXAMPLE 2

The production process was the same as that in Example 1, except for that the compounding ratio of the thermosetting resin composition was changed as shown in Table 2, so as to prepare a copper clad laminate. The performance data thereof are shown in Table 2 below.

EXAMPLES 3-4

The production processes were the same as that in Example 1, except for that the co-crosslinking agent bismaleimide was added. The compounding ratio of the resin composition and the performance data of the prepared copper clad laminates are shown in Table 2 below.

EXAMPLE 5

80 parts by weight of OPE-ST-1200, 20 parts by weight of the phosphorus-containing esterified allyl phenolic resin prepared in Preparation Example 2, 85 parts by weight of silica (525), and 6.5 parts by weight of an initiator DCP were mixed, adjusted to a suitable viscosity with a solvent of toluene, stirred and uniformly mixed to uniformly disperse the filler in the resin, so as to obtain a varnish. 1080 glass fiber cloth was impregnated with the varnish above, and then dried to remove the solvent to obtain a prepreg. Eight sheets of prepared prepregs were laminated, and pressed on both sides thereof with copper foils having a thickness of 1 oz (ounce), and cured in a press for 2 hours at a curing pressure of 50 kg/cm$^2$ and a curing temperature of 190° C. The physical property data are shown in Table 2 below.

EXAMPLE 6

The production process was the same as that in Example 1, except that a small amount of phosphorus-containing esterified diallyl bisphenol A was added. The material ratio and the performance data of the prepared copper clad laminate are shown in Table 2 below.

COMPARISON EXAMPLES 1-2

The production processes were the same as that in Example 1, except for that the phosphorus-containing esterified diallyl bisphenol A was removed, or the phosphorus-containing esterified allyl phenolic resin was replaced by an allyl phenolic resin and a DOPO flame retardant. The material ratio and the performance data of the copper clad laminates prepared are shown in Table 2 below.

Physical Analysis

As can be seen from the results of the physical property data in Table 2, the copper clad laminates prepared in Examples 1-6 have better heat resistance, dip soldering resistance and flame retardancy than those prepared in Comparison Examples 1 and 2.

As can be seen from the results of the physical property data in Table 2, the addition of bismaleimide within the compounding ratio range of the present invention can achieve better heat resistance.

The thermosetting resin composition of the present invention, the prepreg, the metal foil-clad laminate, and the high-frequency circuit board prepared therefrom are described in the above examples. However, the present invention is not limited to the above examples, i.e. it does not mean that the present invention must rely upon the above examples. Those skilled in the art shall know that any modifications of the present invention, equivalent substitutions of the materials selected for use in the present invention, and addition of auxiliary ingredients, and specific manner in which they are selected, all are within the protection scope and disclosure scope of the present invention.

The invention claimed is:

1. A thermosetting resin composition, wherein the thermosetting resin composition comprises thermosetting ingredients which comprise a phosphorus-containing monomer or a phosphorus-containing resin and a polyphenylene ether

TABLE 2

| Materials and properties | Example 1 | Example 2 | Example 3 | Example 4 | Example 5 | Example 6 | Com. Example 1 | Com. Example 2 |
|---|---|---|---|---|---|---|---|---|
| SA9000 | 80 | 60 | 80 | 35 | | 90 | 80 | |
| OPE-ST-1200 | | | | | 80 | | | 80 |
| Phosphorus-containing esterified diallyl bisphenol A | 20 | 40 | | 65 | | 10 | 0 | |
| Phosphorus-containing esterified allyl phenolic resin | | | | | 20 | | | |
| Phosphorus-containing esterified allyl o-cresol novolac resin | | | 20 | | | | | |
| Allyl phenolic resin | | | | | | | | 20 |
| 9,10-dihydro-9-oxa-10-phosphaphenanthrene-10-oxide | | | | | | | | 20 |
| 525 | 85 | 240 | 85 | 85 | 85 | 85 | 85 | 85 |
| Bismaleimide BM-3000 | 0 | 0 | 10 | 15 | 0 | | | |
| DCP | 6.5 | 7.5 | 5.6 | 5.3 | 6.5 | 6 | 5.8 | 6 |
| 1080 glass fiber cloth | 80.7 | 125 | 78 | 85 | 80.7 | 86 | 92 | 85 |
| Dielectric constant (10 GHZ) | 3.78 | 3.86 | 3.83 | 3.96 | 3.80 | 3.53 | 3.5 | 4.08 |
| Dielectric loss tangent (10 GHZ) | 0.0053 | 0.0056 | 0.0056 | 0.0057 | 0.0053 | 0.0048 | 0.004 | 0.023 |
| Dip soldering resistance 288° C., (s) | >120 | >120 | >120 | >120 | >120 | 20 | 15 | 10 |
| Glass transition temperature (° C.) (DSC) | 160 | 173 | 210 | 225 | 165 | 100 | 80 | 135 |
| Flame retardancy | V-1 | V-0 | V-1 | V-0 | V-1 | combustion | Combustion | V-1 |
| Glass impregnation operation | Good | Good | Good | Good | Good | Worse | Worse | worse | resin containing unsaturated groups, wherein the phosphorus-containing monomer or the phosphorus-containing resin has a structure as shown in Formula I:

Formula I

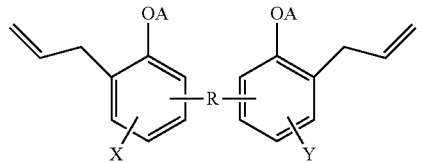

wherein R represents a linear or branched alkyl,

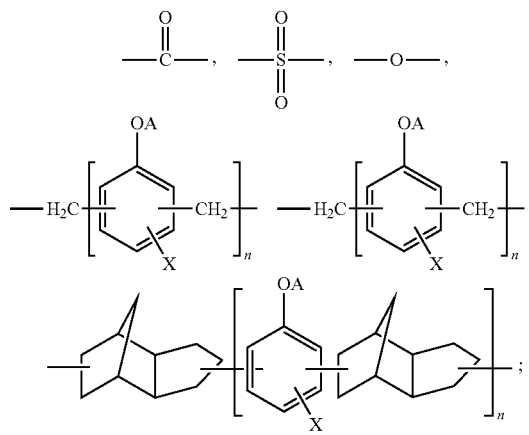

each X and Y are independently selected from the group consisting of hydrogen, allyl, linear alkyl, branched alkyl, and a combination of at least two selected therefrom; each A is a phosphorus-containing capping group; and n is an integer of 1-20.

2. The thermosetting resin composition of claim 1, wherein R represents —CH$_2$—,

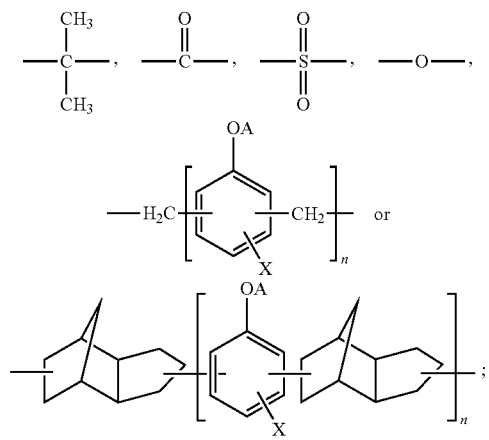

n is an integer of 1-20;
each X and Y are independently selected from the group consisting of hydrogen, allyl, linear alkyl, branched alkyl, and a combination of at least two selected therefrom; and
each A is a phosphorus-containing capping group.

3. The thermosetting resin composition of claim 1, wherein the phosphorus-containing monomer or the phosphorus-containing resin is prepared by the following method comprising the steps of:

(1) a phenolic compound or a phenolic resin of Formula II is reacted with an allylation reagent to obtain an allyl etherified resin of Formula III, wherein the exemplary reaction formula is as follows:

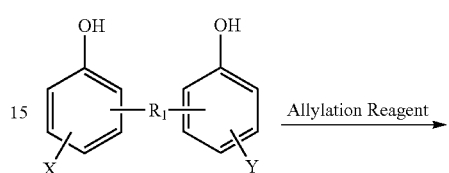

Formula II

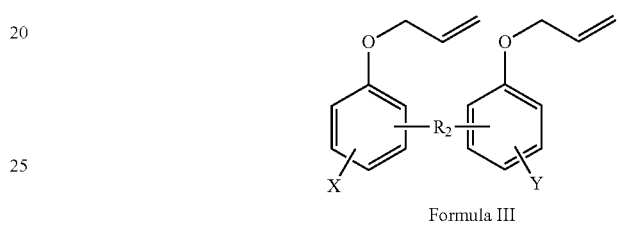

Formula III (2) the allyl etherified resin of Formula III is heated under the protection of protective gas, and an intramolecular rearrangement reaction occurs to obtain an allylated phenolic resin of Formula IV:

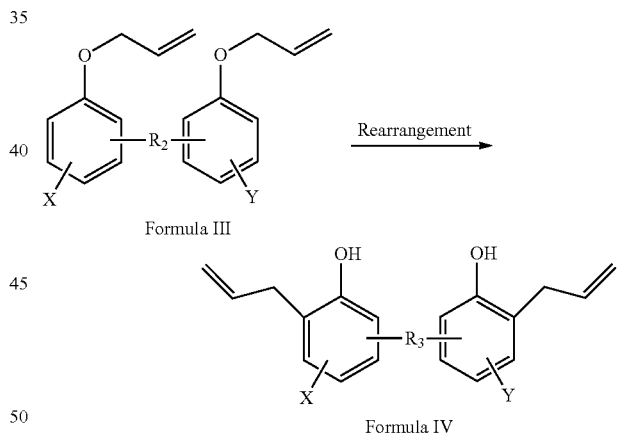

Formula IV (3) the allylated phenolic resin of formula III is reacted with a phosphorus-containing capping reagent to obtain the phosphorus-containing monomer or the phosphorus-containing resin of Formula I:

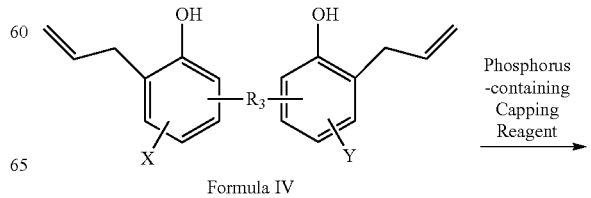

Formula IV

-continued

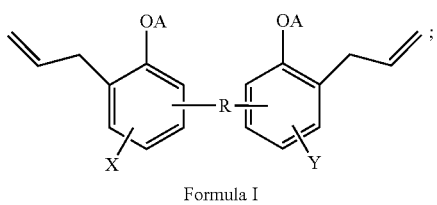

Formula I wherein $R_1$ is selected from the group consisting of linear or branched alkyl,

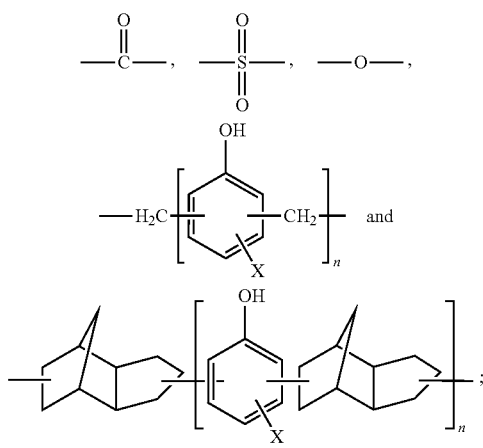

$R_2$ is selected from the group consisting of linear or branched alkyl,

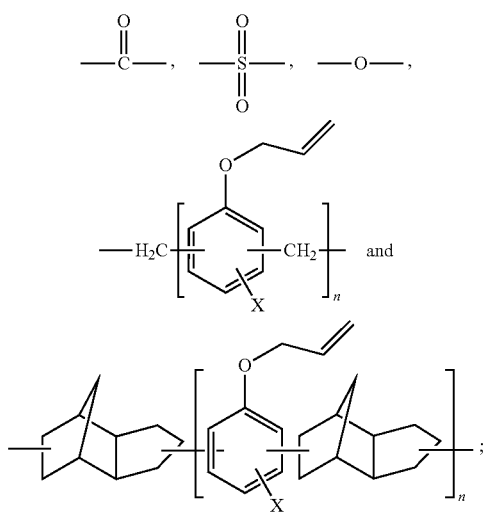

$R_3$ is selected from the group consisting of linear or branched alkyl,

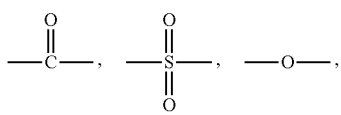

-continued

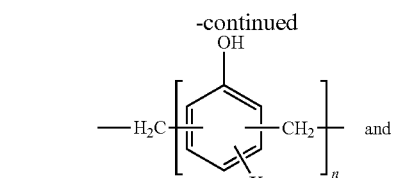

R is selected from the group consisting of linear or branched alkyl,

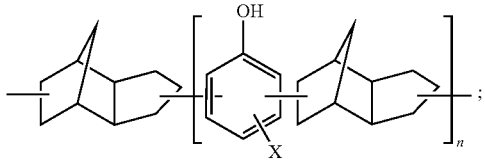

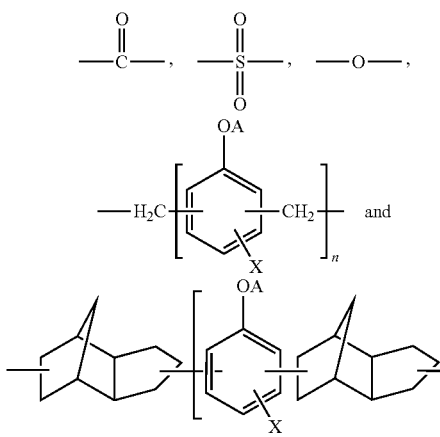

each X and Y are independently selected from the group consisting of hydrogen, allyl, linear alkyl, branched alkyl, and a combination of at least two selected therefrom;
each A is a phosphorus-containing capping group; and
n is an integer of 1-20.

4. The thermosetting resin composition of claim 1, wherein the polyphenylene ether resin containing unsaturated groups is a polyphenylene ether resin containing double bonds or triple bonds.

5. The thermosetting resin composition claimed in claim 4, wherein the polyphenylene ether resin containing unsaturated groups is anyone selected from the group consisting of allyl-terminated polyphenylene ether resin, acrylate-terminated polyphenylene ether resin, vinyl-terminated polyphenylene ether resin, and a combination of at least two selected therefrom.

6. The thermosetting resin composition of claim 1, wherein the thermosetting resin composition further comprises a powder filler.

7. A prepreg, wherein the prepreg comprises a reinforcing material and the thermosetting resin composition of claim 1 which is adhered thereto after impregnation and drying.

8. A laminate, wherein the laminate comprises at least one prepreg of claim 7.

9. A metal foil-clad laminate, wherein the metal foil-clad laminate comprises one or at least two laminated prepregs of claim 7, and metal foil on one side or both sides of the laminated prepreg.

10. A high-frequency circuit board, wherein the high-frequency circuit board comprises one or at least two laminated prepregs of claim 7.

11. The thermosetting resin composition claimed in claim 1, wherein A is a DOPO-containing group.

12. The thermosetting resin composition claimed in claim 11, wherein A is anyone selected from the group consisting of

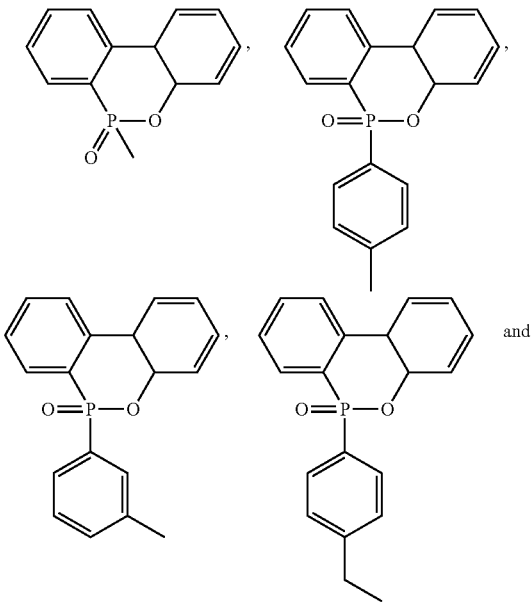

and

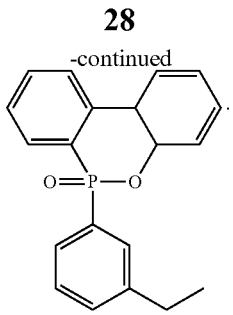

13. The thermosetting resin composition claimed in claim 1, wherein the phosphorus-containing monomer or the phosphorus-containing resin is a phosphorus-containing monomer or a phosphorus-containing resin having a phosphorus content greater than 3%.

14. The thermosetting resin composition claimed in claim 1, wherein the phosphorus-containing monomer or the phosphorus-containing resin is anyone selected from the group consisting of the compounds having the following structures of Formulae A-D, and a combination of at least two selected therefrom:

Formula A

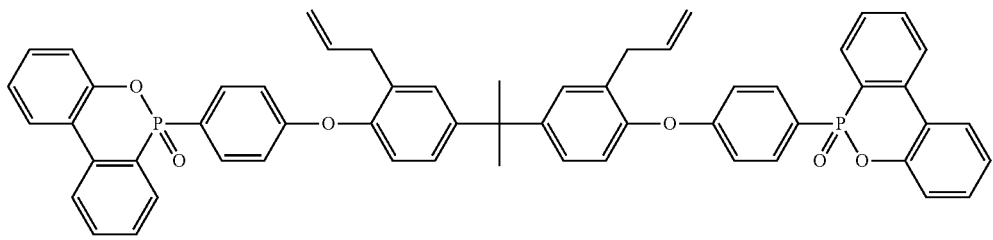

Formula B

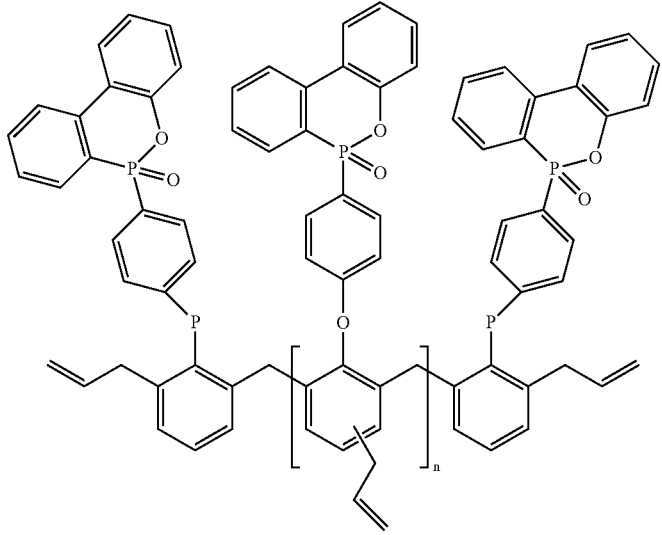

-continued

Formula C

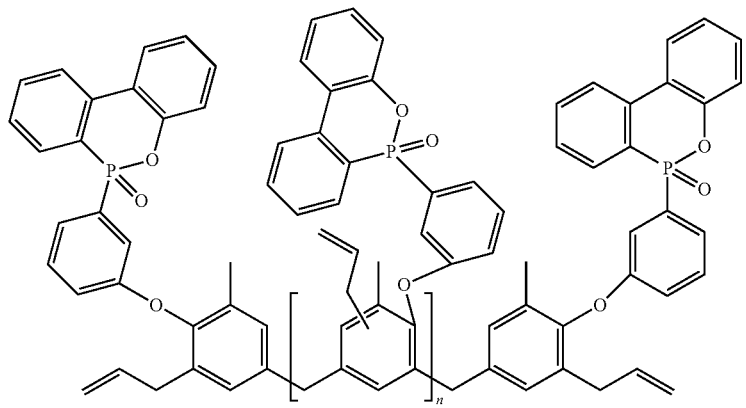

Formula D

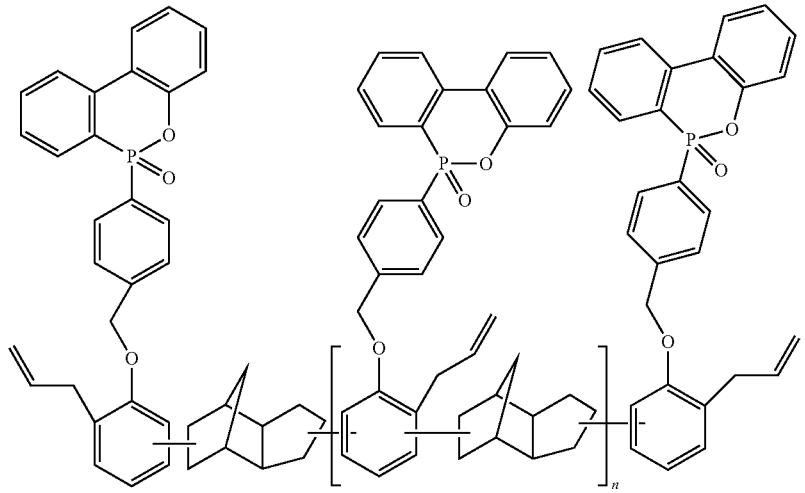

wherein n is an integer of 1-20.

15. The thermosetting resin composition claimed in claim 1, wherein the polyphenylene ether resin containing unsaturated groups has a number average molecular weight of 700-8,000.

16. The thermosetting resin composition claimed in claim 1, wherein the thermosetting ingredients account for 5 to 90% by weight of the thermosetting resin composition;
the phosphorus-containing monomer or the phosphorus-containing resin accounts for 20 to 75% of the total weight of the polyphenylene ether resin containing unsaturated groups and the phosphorus-containing monomer or the phosphorus-containing resin.

17. The thermosetting resin composition claimed in claim 1, wherein the thermosetting resin composition further comprises a curing initiator.

18. The thermosetting resin composition claimed in claim 1, wherein the thermosetting resin composition further comprises a co-crosslinking agent comprising a monomer or a low-molecular copolymer having unsaturated double bonds or unsaturated triple bonds in the molecular structure.

19. The thermosetting resin composition claimed in claim 1, wherein the co-crosslinking agent is anyone selected from the group consisting of triallyl tripolyisocyanurate, triallyl tripolycyanurate, divinylbenzene, polyfunctional acrylate, bismaleimide, and a combination of at least two selected therefrom.

20. The thermosetting resin composition claimed in claim 1, wherein the thermosetting resin composition further comprises other thermosetting resins.

21. The thermosetting resin composition claimed in claim 20, wherein the other thermosetting resins selected from the group consisting of cyanate resin, polybutadiene resin, bismaleimide resin, vinyl-terminated silicone resin, and a combination of at least two selected therefrom.

* * * * *